United States Patent
Jung et al.

(10) Patent No.: US 10,340,406 B2
(45) Date of Patent: Jul. 2, 2019

(54) DISTRIBUTED PHOTODIODE WITH BUILT-IN EQUALIZATION

(71) Applicant: Purdue Research Foundation, West Lafayette, IN (US)

(72) Inventors: Byunghoo Jung, West Lafayette, IN (US); Bongchan Kim, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/785,411

(22) Filed: Oct. 16, 2017

(65) Prior Publication Data

US 2018/0108798 A1 Apr. 19, 2018

Related U.S. Application Data

(60) Provisional application No. 62/408,124, filed on Oct. 14, 2016.

(51) Int. Cl.
*H03H 15/02* (2006.01)
*H01L 31/08* (2006.01)
*H01L 27/144* (2006.01)
*H01L 31/101* (2006.01)

(52) U.S. Cl.
CPC ............ *H01L 31/08* (2013.01); *H01L 27/144* (2013.01); *H01L 31/101* (2013.01); *H03H 15/02* (2013.01)

(58) Field of Classification Search
CPC ..... H01L 23/5227; H01L 28/10; H01L 28/20; H01L 28/40; H03H 15/02
See application file for complete search history.

(56) References Cited

U.S. PATENT DOCUMENTS 9,705,412 B2 * 7/2017 Adragna ........... H02M 3/33569

OTHER PUBLICATIONS

Hermans, C., Steyaert, M., "A high-speed A high-speed 850-nm optical receiver front-end in 0.18-μm CMOS," IEEE J. Solid-State Circuits, vol. 41, No. 7, 2016, pp. 1606-1614.
Tavernier, F., Steyaert, M., "Power efficient 4.5Gbit/s optical receiver in 130nm CMOS with integrated photodiode," IEEE ESSCIRC, 2008, pp. 162-165.
Lee, D., Han, J., Park, S. M., "An 8.5-Gb/s fully integrated, CMOS optoelectronic receiver using slope-detection adaptive equalizer," IEEE J. Solid-State Circuits, vol. 45, No. 12, 2010, pp. 2861-2873.

(Continued)

*Primary Examiner* — Quoc D Hoang
(74) *Attorney, Agent, or Firm* — Purdue Research Foundation (57) ABSTRACT

A distributed photodiode with FIR filtering function enabled by a lumped transmission line is provided. The distributed photodiode includes inductors, a plurality of photodiode segments, photodiode biasing components, and termination impedance. The electrical bandwidth due to the junction parasitic capacitance of the photodiode is increased as the parasitic capacitance is absorbed in the transmission line structure. Moreover, the delay elements inherent in the transmission line enable implementation of an analog finite impulse response (FIR) filter that has equalization capability to allow a customized photodiode frequency response compensation.

9 Claims, 7 Drawing Sheets

(56) References Cited

OTHER PUBLICATIONS

Genoe, J., Coppee, D., Stiens, J., Vounckx, R., Kuijk, M., "Calculation of the current response of the spatially modulated light CMOS detector," IEEE Trans. Electron Devices, vol. 48, No. 9, 2001, pp. 1892-1902.
Huang, S., Chen, W., Chang, Y., Huang, Y., "A 10-Gb/s OEIC with meshed spatially-modulated photo detector in 0.18-µm CMOS technology," IEEE J. Solid-State Circuits, vol. 46, No. 5, 2011, pp. 1158-1169.
Analui, B., Hajimiri, A., "Bandwidth Enhancement for Transimpedance Amplifiers," IEEE J. Solid-State Circuits, vol. 39, No. 8, 2014, pp. 1263-1270.
Gould, M., Baehr-Jones, T., Ding, R., Hochberg, M., "Bandwidth enhancement of waveguide-coupled photodetectors with inductive gain peaking," Opt. Express, vol. 20, No. 7, 2012, pp. 7101-7111.
Staric, P., Margan, E., "Part 2: Inductive peaking circuits," in Wideband amplifiers, Dordrecht, The Netherlands: Springer, 2007, 112 pages.

\* cited by examiner

FIG. 5

DISTRIBUTED PHOTODIODE WITH BUILT-IN EQUALIZATION

CROSS-REFERENCE TO RELATED APPLICATIONS

The present application is related to and claims the priority benefit of U.S. Provisional Patent Application Ser. No. 62/408124, filed Oct. 14, 2016, the contents of which are hereby incorporated by reference in their entirety into this disclosure.

FIELD OF THE INVENTION

The invention relates to optical communications systems, and more specifically, a distributed photodiode with a finite impulse response (FIR) filtering function for bandwidth improvement which is enabled by a lumped transmission line using the photodiodes' parasitic junction capacitances and inductors.

BACKGROUND

Today, silicon photodiodes for short range applications such as board-to-board and inter-chip optical communications are receiving much attention due to their low cost and capability to integrate with CMOS circuitry. Since the state-of-the-art technology provides shallow n-well depth around 1 µm or less and the absorption depth of 850 nm light in silicon is about 28 µm, the electrons generated in the substrate have to slowly diffuse a long distance to reach the depletion region to be collected as a photocurrent. Consequently, this substrate diffusion current component limits the bandwidth of the silicon photodiode. In order to boost the bandwidth of the silicon photodiode, prior art systems have applied differential or spatially modulated techniques to eliminate the slow substrate diffusion current. Other prior art approaches to enhance the bandwidth include modifying the applied reverse voltage or structure of the photodiode. However, these techniques have drawbacks, such as reduced responsivity. Therefore, improvements are needed in the field.

SUMMARY

The present disclosure is directed to a distributed photodiode, which improves both the electrical and the intrinsic bandwidth of a silicon photodiode fabricated in CMOS technology. In an exemplary embodiment of the disclosure, the silicon photodiode is segmented into a plurality of photodiode segments. Along with additional inductors, these photodiode segments together constitute a transmission line. In this way, the electrical bandwidth due to the junction parasitic capacitance of the photodiode is improved.

Furthermore, recognizing that the lumped transmission line contains delay elements, an analog finite impulse response (AFIR) filter with arbitrary filter coefficients may be implemented using the segmented photodiode system. The intrinsic frequency response of the Si photodiode may be compensated to some extent by setting the coefficients of the AFIR filter so that it behaves as a high pass filter.

According to one aspect, a distributed photodiode is disclosed, comprising n photodiode segments, wherein a junction capacitance of the photodiode segments contributes in forming a transmission line, n+1 inductors for forming the transmission line, the inductors connected between the photodiode segments, wherein the n+1 inductors are connected in series, and a biasing capacitor and a resistor both connected to an anode or cathode of the n photodiode segments. The photodiode segments are configured to provide a FIR filtering function.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

The attached drawings are for purposes of illustration and are not necessarily to scale.

DETAILED DESCRIPTION OF THE EMBODIMENTS

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

On-chip Si photodiodes, typically having an N-well to P-substrate structure, affect the entire receiver bandwidth in two ways. First, parasitic capacitance resulting from the PN-junction of the photodiode introduces a pole in the receiver transfer function which is in general the dominant pole. The other factor is the intrinsic bandwidth of the photodiode. This type of bandwidth is caused by the slow P-substrate diffusion current component which is typically in the order of several mega-hertz.

According to one embodiment of the present disclosure, the photodiode is divided into several segments instead of implementing it as a single unitary structure. The parasitic capacitances of the resulting segmented photodiodes, along with additional inductors, are used to build a lumped transmission line so that the electrical bandwidth due to the photodiode is improved. The transmission line is terminated by the characteristic impedance at both ends of the transmission line, the impedance being provided by a connected transimpedance amplifier.

Figure 1:
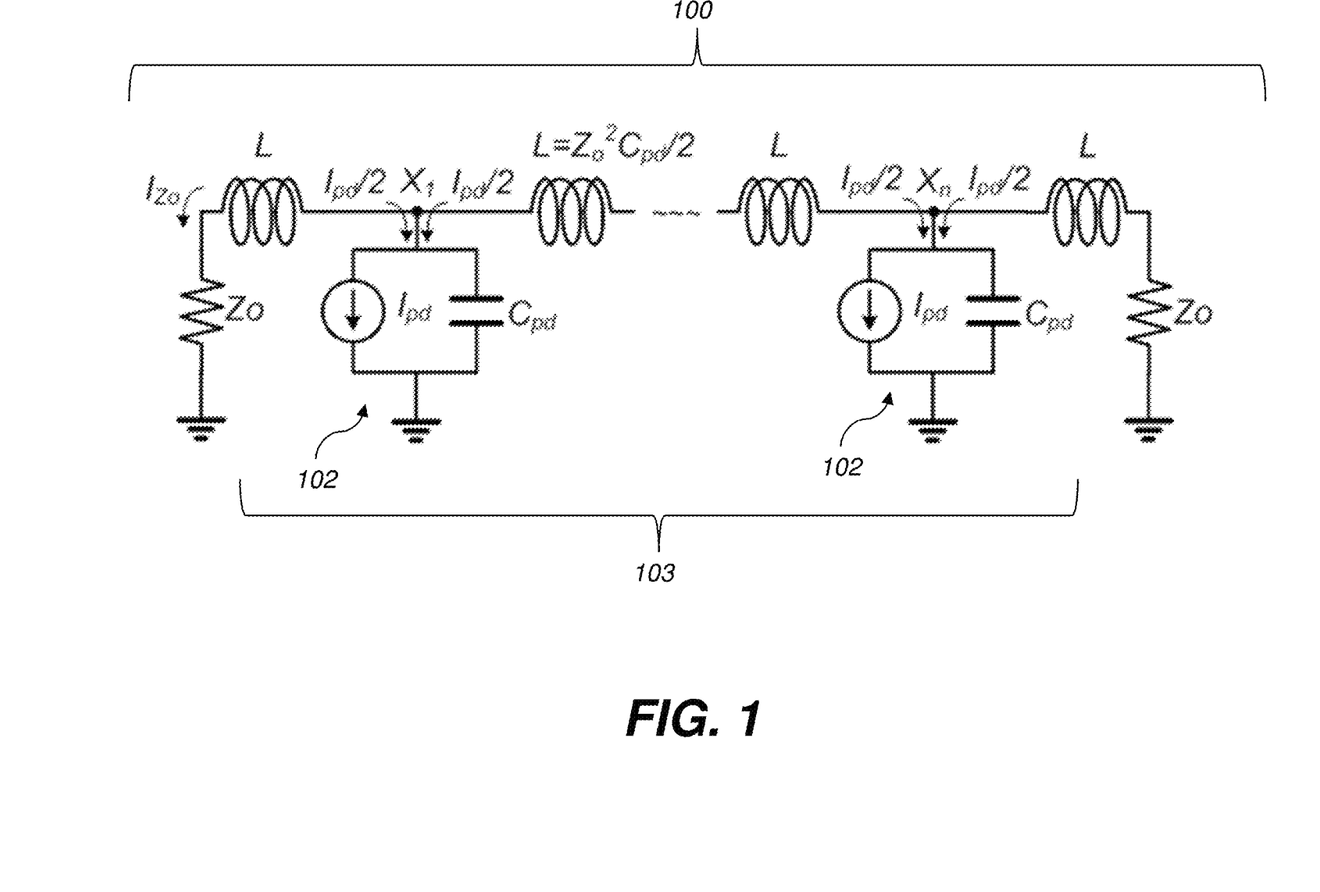
FIG. 1 is a schematic diagram of a lumped transmission line implemented using a segmented photodiode according to one embodiment.

FIG. 1 illustrates a schematic diagram of a lumped transmission line 100 according to one embodiment of the present disclosure. Each segment 102 of the segmented photodiode 103 is represented as its small-signal equivalent circuit comprising a current source ($I_{pd}$) and a capacitance ($C_{pd}$) as shown. The inductors (L) are connected in series, with the unit photodiodes (photodiode segments) connected at nodes between the inductors as shown in FIG. 1.

Figure 2:
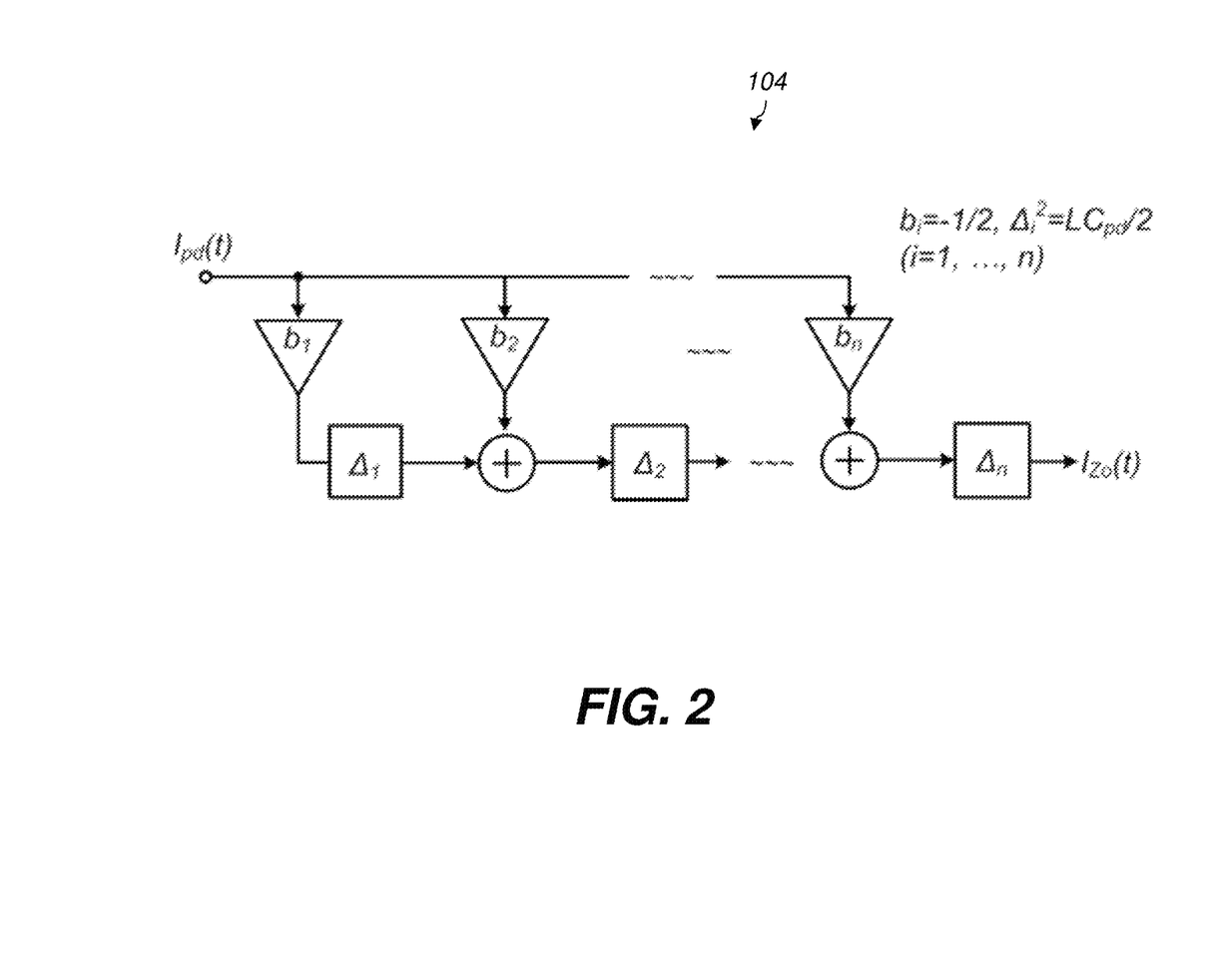
FIG. 2 illustrates the analog finite impulse response (AFIR) filter that has input and output as photo-generated current ($I_{pd}$) from one of an equally segmented photodiode and the current ($I_{Zo}$) flowing through the left side termination in FIG. 1, respectively.

The photo-generated current ($I_{pd}$) from one segment of an equally segmented photodiode and the current ($I_{Zo}$) flowing through the left side termination in FIG. 1 corresponds to the input $I_{pd}(t)$ and the output $I_{Zo}(t)$, respectively, of the analog finite impulse response (AFIR) filter 104 illustrated in FIG. 2. Therefore, by selectively adjusting the coefficients ($b_{1-n}$) of the AFIR filter, an equalization function may be realized which compensates for a photodiode's intrinsic frequency response. According to one embodiment, where the coefficients are chosen to be symmetric, currents ($I_{Zo}$) through the left and the right side terminations of the transmission line are the same, and thus can be added to avoid 6 dB gain loss.

Figure 3A:
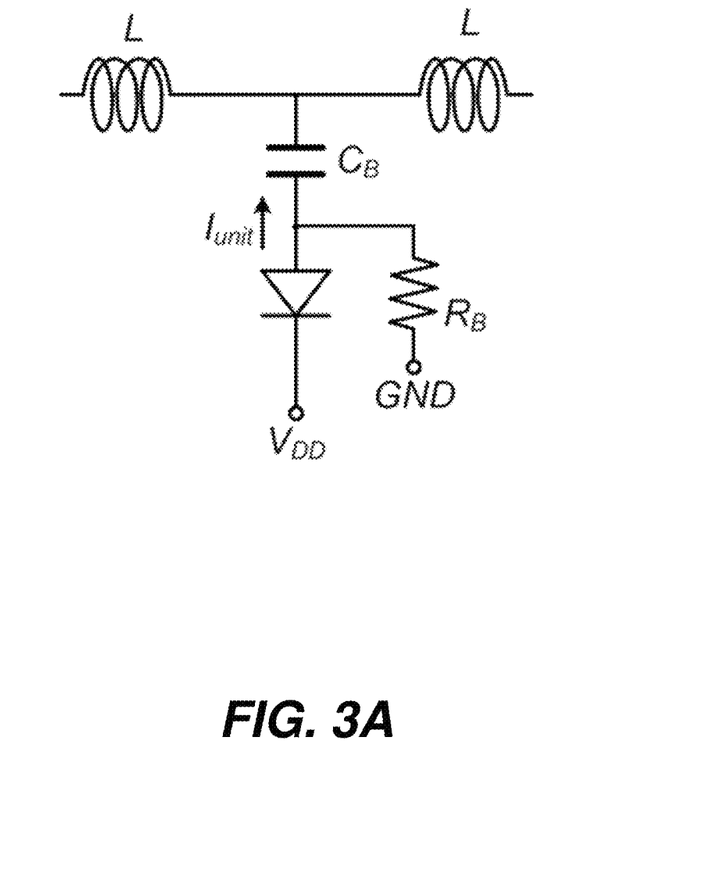
FIG. 3A shows a unit size photodiode's connection to the inductors of the transmission line for a positive filter coefficient.
Figure 3B:
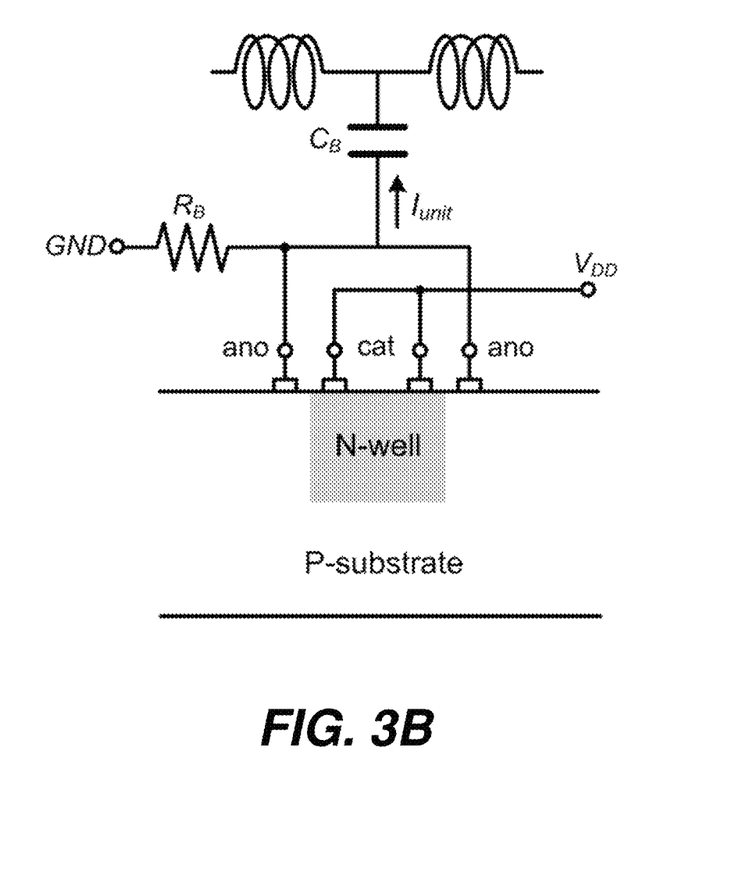
FIG. 3B illustrates a cross-sectional structural diagram of FIG. 3A.
Figure 4A:
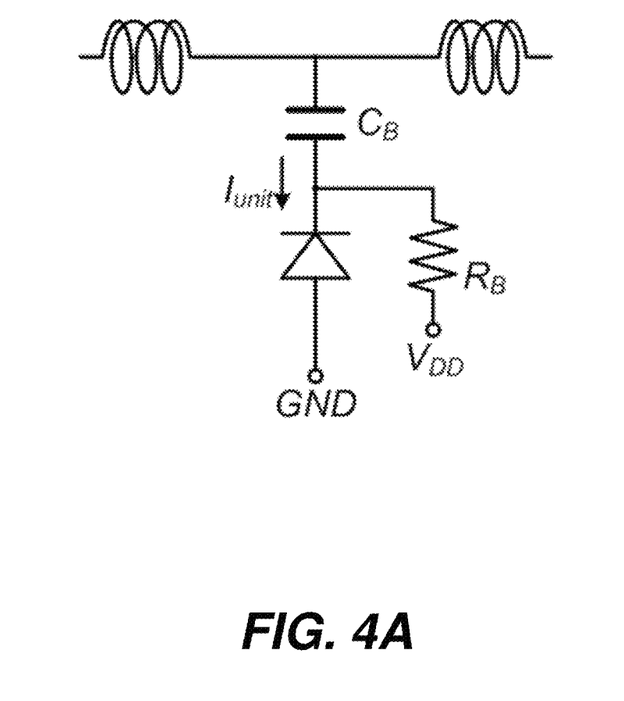
FIG. 4A shows a unit size photodiode's connection to the inductors of the transmission line for a negative filter coefficient.
Figure 4B:
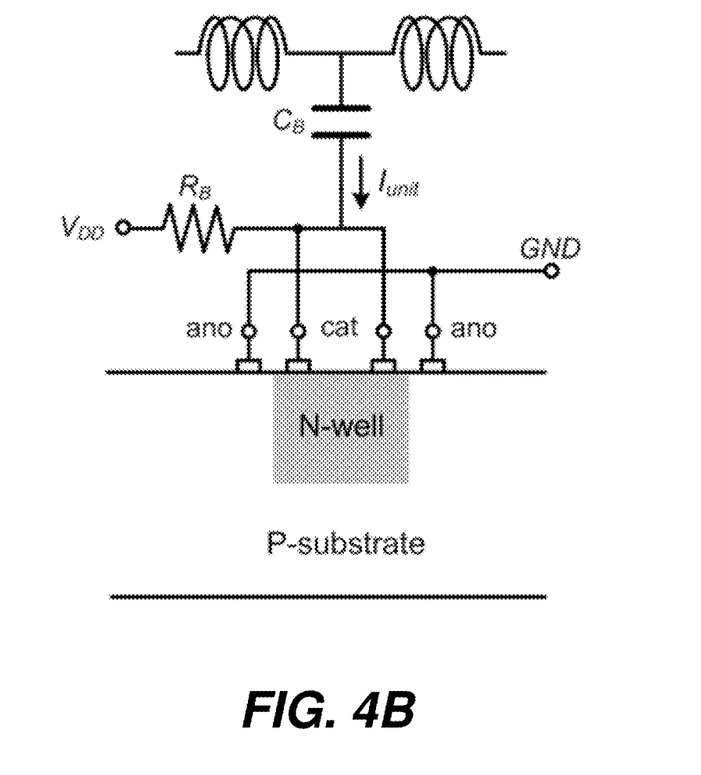
FIG. 4B illustrates the cross-sectional structural diagram of FIG. 4A.

Since the frequency response characteristics depend on the dimension of the photodiode, rather than varying the dimension of the photodiode, a number of unit size photodiodes (photodiode segments) are combined according to the present disclosure to generate the desired associated filter coefficient. Moreover, to implement both positive and negative polarity coefficients, extra biasing components such as capacitors $C_B$ and resistors $R_B$ are used to connect the photodiode to the inductors of the transmission line as shown. For positive filter coefficient, a unit size photodiode is connected to the inductors of the transmission line as illustrated in FIG. 3A. The cross-sectional structural diagram of FIG. 3A is illustrated in FIG. 3B. Likewise, for a desired negative filter coefficient, a unit size photodiode is connected to the inductors L of the transmission line as illustrated in FIG. 4A. The cross-sectional structural diagram of FIG. 4A is illustrated in FIG. 4B.

Figure 5:
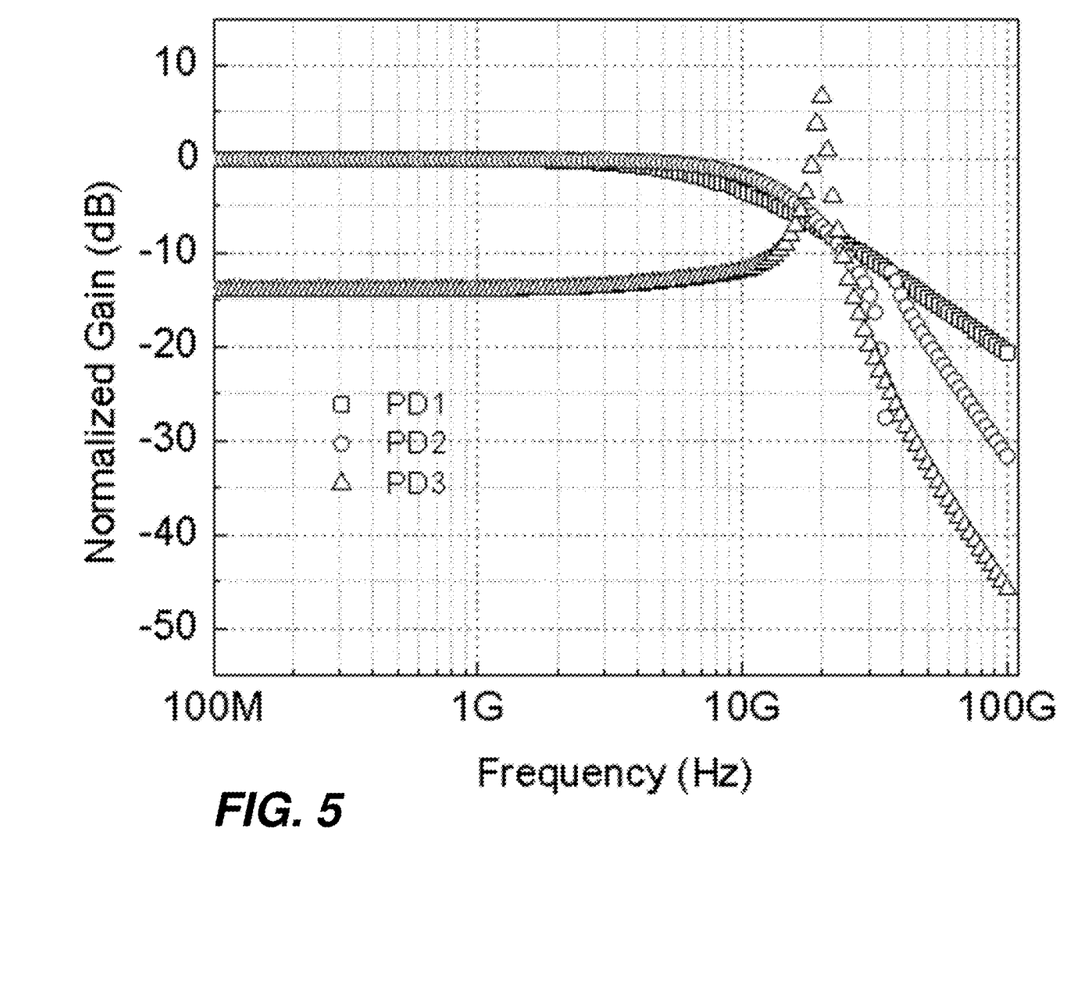
FIG. 5 shows normalized gain simulation results for three different types of photodiodes.

FIG. 5 compares the normalized gain simulation results for 3 different photodiodes. In all of the simulation cases, the dimension of the total photodiode, and thus the total parasitic capacitance (680 fF) and the total photocurrent (1 A), are assumed to be the same. Both ends of the transmission line are terminated by 50 Ω. The plot for PD1 is when the photodiode is used as a whole (i.e., an unsegmented unitary structure). The intrinsic frequency response of the photodiode is not included in the illustrated simulation result and the bandwidth of PD1 is determined by the photodiode parasitic capacitance (680 fF) and 25 Ω. Note that 25 Ω is used for a fair comparison with other cases as they employ two 50 Ω for transmission line terminations. The plot for PD2 illustrates the case when equi-oriented and three equally photodiode segments are used as in FIG. 1 with n=3. The −3 dB bandwidths of PD1 and PD2 are 9.3 GHz and 12.9 GHz, respectively. The plot for PD3 illustrates the case when the orientation as well as the segmentation of the photodiode is varied to realize weighted coefficients of the AFIR filter. One thing to note about the simulation condition for PD3 is that extra capacitance has to be added to the parasitic capacitance of every other segmented photodiodes to match the parasitic capacitance (408 fF) of the largest segmented photodiode which serves as the main tap. The coefficients used for the simulation are −0.2, 0.6, and −0.2. Gain boosting of 20 dB occurs for PD3 from 1 GHz to 20 GHz at the cost of roughly 14 dB reduction in the low frequency gain. This gain boosting can be used to compensate the photodiode's intrinsic frequency response (gain decrease) above 1 GHz.

The disclosed device may be used to achieve communication between electronic devices, such as chip-to-chip, board-to-board, "last mile" internet connectivity, and the like.

In summary, in the disclosed exemplary embodiments, a distributed photodiode with FIR filtering function enabled by a lumped transmission line provides an increased electrical bandwidth and equalization capability for compensating the photodiode's intrinsic frequency response above 1 GHz.

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

What is claimed is:

1. A distributed photodiode comprising:
    n photodiode segments, wherein a junction capacitance of the photodiode segments contributes in forming a transmission line, wherein n is an integer greater than 2;
    n+1 inductors for forming the transmission line, the inductors connected between the photodiode segments, wherein the n+1 inductors are connected in series; and
    a biasing capacitor and a biasing resistor both connected to an anode or cathode of the n photodiode segments.

2. The distributed photodiode according to claim 1, wherein the photodiode segments are configured to provide a FIR filtering function.

3. The distributed photodiode according to claim 1, wherein the series connected n+1 inductors are terminated by a characteristic impedance of the transmission line.

4. The distributed photodiode according to claim 1, wherein the biasing resistor is inserted between an anode of the photodiode segments and ground for a positive polarity tap coefficient realization by the associated photodiode segment.

5. The distributed photodiode according to claim 1, wherein the biasing capacitor is inserted between an anode of the photodiode segments and an intersection node of two of said inductors for a positive polarity tap coefficient realization by the associated photodiode segment.

6. The distributed photodiode according to claim 1, wherein the biasing resistor is inserted between a cathode of the photodiode segments and a supply voltage for a negative polarity tap coefficient realization by the associated photodiode segment.

7. The distributed photodiode according to claim 1, wherein the biasing capacitor is inserted between a cathode of the photodiode and an intersection node of two of said inductors for a negative polarity tap coefficient realization by the associated photodiode segment.

8. The distributed photodiode according to claim 1, wherein each of the n photodiode segments is composed with differently sized photodiodes to realize different tap coefficients.

9. The distributed photodiode according to claim 1, wherein the photodiode is formed from silicon using a CMOS process.

\* \* \* \* \*